(12) United States Patent
Cho

(10) Patent No.: US 6,719,917 B2
(45) Date of Patent: Apr. 13, 2004

(54) METHOD OF ASHING SEMICONDUCTOR DEVICE HAVING METAL INTERCONNECTION

(75) Inventor: Sung-Dong Cho, Kyunggi-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/218,014

(22) Filed: Aug. 12, 2002

(65) Prior Publication Data

US 2003/0109393 A1 Jun. 12, 2003

(30) Foreign Application Priority Data

Aug. 14, 2001 (KR) ........................................ 2001-48971

(51) Int. Cl.[7] ................................................. B44C 1/22
(52) U.S. Cl. ..................... 216/67; 252/79.1; 438/720; 510/175; 510/176; 134/113
(58) Field of Search ................. 216/67; 252/79.1; 134/2, 3; 438/720, 725; 510/175, 176

(56) References Cited

U.S. PATENT DOCUMENTS 5,007,981 A * 4/1991 Kawasaki
5,200,031 A    4/1993 Latchford et al.
5,630,904 A * 5/1997 Aoyama
5,925,577 A * 7/1999 Solis

FOREIGN PATENT DOCUMENTS

KR    1019960009976    7/1996

OTHER PUBLICATIONS

English language abstract of Korea Patent No. 1019960009976, 1996.

* cited by examiner

Primary Examiner—Gregory Webb
(74) Attorney, Agent, or Firm—Marger Johnson & McCollom, PC.

(57) ABSTRACT

A method for ashing a semiconductor device is provided. In the method, the semiconductor substrate, on which a metal interconnection and a photoresist pattern are formed, is processed using $H_2O$, and then, by using a mixture of $O_2$, $N_2$, and $H_2O$. The process is performed at least twice repeatedly. As a result, corrosion of the metal interconnection is inhibited and a bridge caused by conductive polymer is prevented.

18 Claims, 2 Drawing Sheets

METHOD OF ASHING SEMICONDUCTOR DEVICE HAVING METAL INTERCONNECTION

RELATED APPLICATION

This application claims priority from Korean Patent Application No. 2001-48971, filed on Aug. 14, 2001, the contents of which are incorporated herein by reference in their entirety.

BACKGROUND OF THE INVENTION

1. Field of the Invention

The present invention relates to a method for fabricating a semiconductor device and, more particularly, to a method of ashing a semiconductor device having a metal interconnection.

2. Description of the Related Art

To complete the formation of integrated circuits, interconnections such as metal interconnections are used to interconnect semiconductor devices formed in the semiconductor substrate. The metal interconnections may be formed by an anisotropic etch process using a chlorine-based chemical material, e.g., $Cl_2$ and $BCl_3$, as an etching gas. After the etch process, chlorine still remains in polymer formed on the sides of the metal interconnections. As a result, when the semiconductor substrate is unloaded from a reaction chamber after the etch process, chlorine reacts with hydrogen in the air, forming HCl which causes corrosion of the metal interconnections. Also, after forming the metal interconnections, the remaining photoresist pattern and polymer can form a bridge between the metal interconnections. Therefore, it is necessary to completely remove the remaining photoresist pattern and polymer.

In order to solve the above-mentioned problems, an ashing process has been introduced. In the ashing process, the remaining chlorine is removed in the first step. Then, the remaining photoresist pattern and polymer are removed in the second step. Korean laid-open Patent No. 96-009976 suggests an ashing process using $CF_4$ gas and $O_2$ gas during the first step and using $O_2$ gas and $N_2$ gas during the second step. However, in this method, the surface of metal interconnections may be attacked. Also, U.S. Patent Publication No. 5,200,031 discloses an ashing method using NH3 gas during the first step and using $O_2$ gas and $NH_3$ gas during the second step. However, the foregoing ashing method cannot completely remove the remaining chlorine, photoresist pattern or polymer.

SUMMARY OF THE INVENTION

The present invention provides a method of ashing a semiconductor device, which inhibits corrosion of a metal interconnection and sufficiently removes a photoresist pattern and polymer.

According to an embodiment of the present invention, a method of ashing a semiconductor device having a metal interconnection comprises a loop including a first step of using a passivating gas and a second step of using a stripping gas. The process is preferably performed at least two times alternately or repeatedly. The passivating gas preferably includes water vapor and the stripping gas preferably includes a gas mixture of oxygen, nitrogen and water vapor. The stripping gas may include a mixture of only oxygen and nitrogen. It is preferable to proceed with the steps of using the passivating gas and using the stripping gas under a pressure of 0.5 to 3 Torr and at a temperature of 200 to 270° C. It is also preferable to proceed with the steps of using the passivating gas and using the stripping gas successively in the same reaction chamber.

A method of forming the metal interconnection comprises the steps of forming a metal layer on a semiconductor substrate; forming a photoresist pattern on the metal layer; and etching the metal layer using the photoresist pattern as an etch mask. The step of etching the metal layer is carried out using a mixture of $Cl_2$ and $BCl_3$ as an etch gas.

BRIEF DESCRIPTION OF THE DRAWINGS

The above and other objects, features and advantages of the present invention will become more apparent from the following detailed description, when taken in conjunction with the accompanying drawings, in which like reference symbols indicate the same or similar components, wherein.

DETAILED DESCRIPTION

Figure 1:
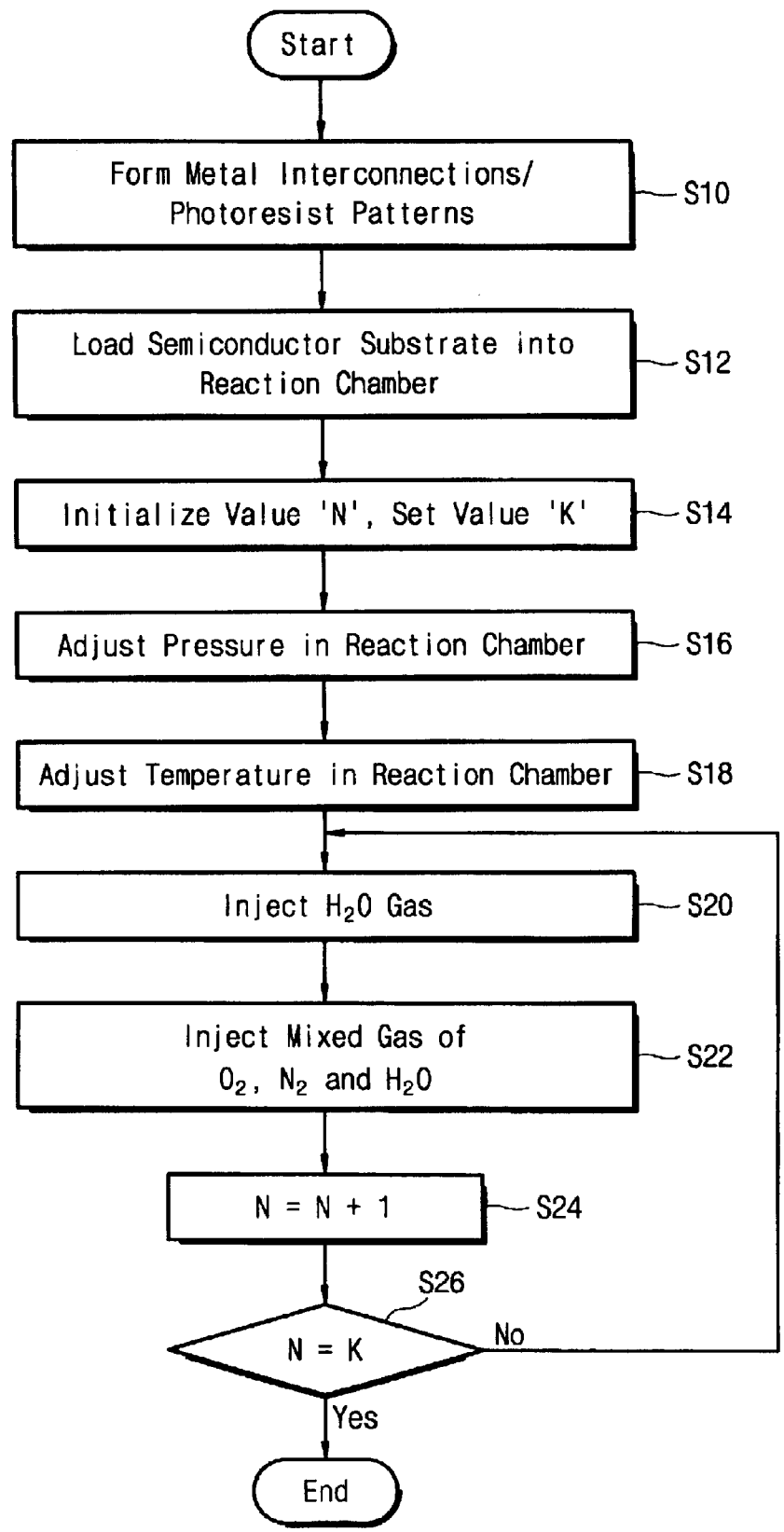
FIG. 1 is a flowchart illustrating the process according to an embodiment of the present invention.

Referring to FIG. 1, a metal layer and a photoresist pattern are successively stacked on a semiconductor substrate. A metal interconnection is formed by etching the metal layer using the photoresist pattern as an etch mask (S10).

The metal layer is typically made of aluminum. Alternatively, it can be also made of metals such as copper, titanium and tungsten. An anisotropic etching process is used to form the metal interconnections, preferably, using $Cl_2$, $BCl_3$, or a mixture thereof as an etch gas. After etching of the metal layer, however, chlorine-containing polymer may remain on the metal interconnection and the sidewalls of the photoresist pattern.

According to an embodiment of the present invention, the semiconductor substrate having the metal interconnections is loaded into the chamber of an ashing apparatus having a plasma generator (S12). The interval between steps S10 and S12 is preferably reduced.

Figure 2:
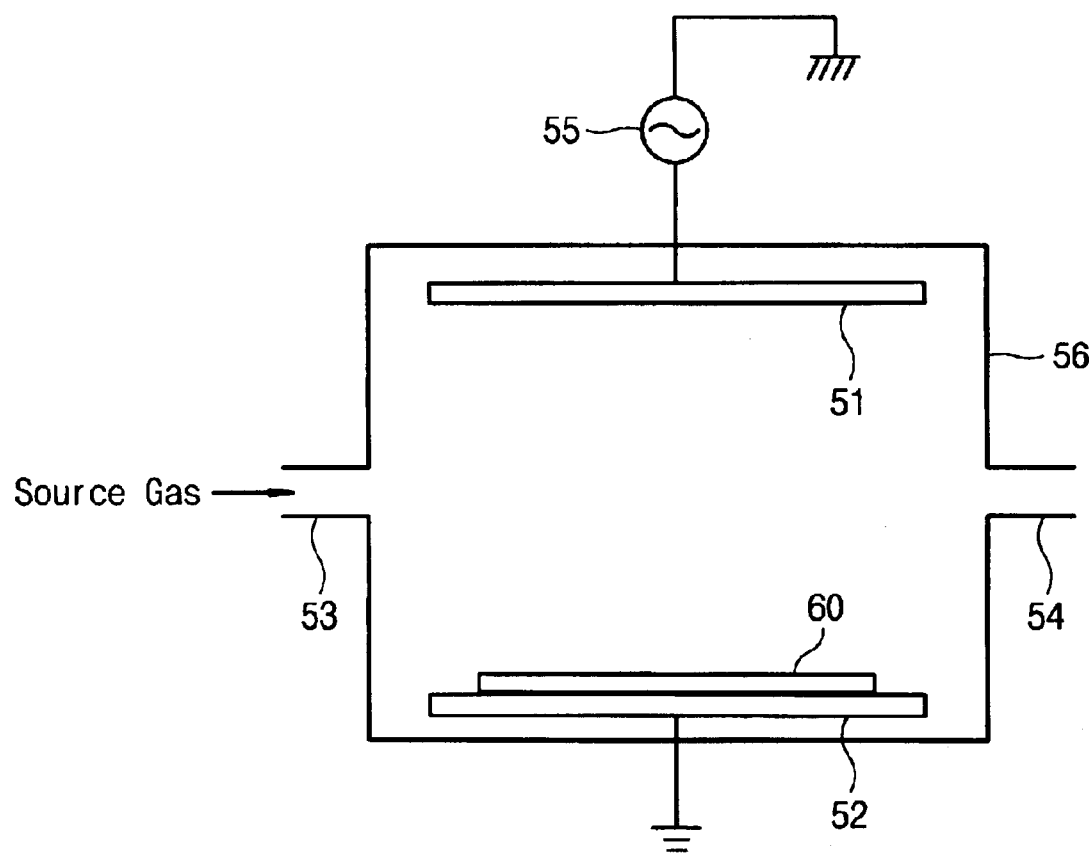
FIG. 2 is a cross-sectional view of an ashing apparatus used in the present invention.

Referring to FIG. 2, an ashing apparatus 50 has a reaction chamber 56 including an upper electrode 51 for generating plasma and a lower electrode 52 on which a semiconductor substrate 60 is loaded. The upper electrode 51 is connected to the plasma generator 55. Also, the reaction chamber 56 has an injection line 53 for injecting a source gas and an exhausting line 54 for exhausting a reaction gas.

Referring again to FIGS. 1 and 2, a value of a variable "N" is allocated to a first register in a controller of the ashing apparatus 50 and is initialized to "0". Simultaneously, a value "K" allocated to a second register is adjusted to a desired cycle number (S14). "N" is a variable indicating the number of repeated processes and "K" is a desired total cycle number.

The inside of the chamber is adjusted to a pressure lower than atmospheric pressure, e.g., a pressure of 0.5 to 3 Torr by exhausting air from the ashing chamber 56 using a vacuum pump (S16). Next, the semiconductor substrate 60 having a metal interconnection and a photoresist pattern is heated to a desired temperature, e.g., 200 to 270° C. (S18). Then, a power and a frequency of the plasma generator 55 are adjusted to 2000–3000W and 2.45 GHz, respectively.

The first step is carried out by injecting a passivating gas into the ashing chamber for a first duration (T1), for example, 5 to 40 seconds (S20). The passivating gas preferably includes water vapor, and the water vapor is preferably injected into the ashing chamber at a flow rate of 2000 to 4000 standard cubic centimeters per minute (sccm).

Under the pressure, temperature and plasma conditions as mentioned above, the water vapor reacts with aluminum of the metal layer and chlorine remaining in the polymer and this generates a passivation substance such as $AlCl_xO_y$. Because the $AlCl_xO_y$ is not a volatile substance, it is not exhausted out of the chamber. However, because $AlCl_xO_y$ is a compound that prevents $Cl_2$ from forming HCl, it inhibits corrosion of the metal interconnection.

Next, the second step is performed by injecting a stripping gas into the same chamber for a second duration (T2), for example, 5 to 60 seconds (S22). During the second step, the remaining photoresist pattern and the polymer are removed from the semiconductor substrate. The pressure, temperature and plasma conditions in the chamber are similar to or the same as those used in the first step. The stripping gas preferably includes a mixed gas of oxygen, nitrogen and water vapor. Oxygen, nitrogen and water vapor are injected into the reaction chamber preferably at a flow rate of 5000–10000 sccm, 300–800 sccm and 1–1000 sccm, respectively. Alternatively, the stripping gas may be composed of only oxygen and nitrogen.

As mentioned above, process time can be reduced by performing the first (S20) and second (S22) steps in the same chamber, and by uniformly maintaining the pressure, temperature and plasma conditions of the chamber. However, it is possible to adjust the temperature of the first step (S20) lower than that of the second step (S22) so as to prevent hardening of the polymer.

After blocking injection of the stripping gas, a value of the variable "N" is increased up to "1" (S24). Subsequently, the value "N" is compared with a value "K"(S26). The first (S20) and second (S22) steps are carried out repeatedly until the value "N" is equal to the value "K".

Considering efficiency and stability in the method for-fabricating a semiconductor device, the value "K" is preferably "3". That is, it is preferable to carry out a process including the first (S20) and second (S22) steps three times repeatedly. In this case, preferable process conditions are as follows:

TABLE 1

| Common process conditions | |
| --- | --- |
| Temperature | 250° C. |
| Pressure | 1.3 Torr |
| Plasma Generating Power | 2600 W |
| Plasma Frequency | 2.45 GHz |

Table 1 shows process conditions common to both the first step (S20) and the second step (S22). As mentioned above, temperature conditions of the first step may be adjusted lower than those of the second step to prevent hardening of polymer.

TABLE 2

| Process conditions of each step | | | | | | |
| --- | --- | --- | --- | --- | --- | --- |
| | Used gas | | | Process time (second) | | |
| | Flow rate (sccm) | | | 1 | 2 | 3 |
| Final step | $H_2O$ 3000 | | | 20 | 20 | 20 |
| Second step | $O_2$ 7500 | $N_2$ 400 | $H_2O$ 350 | 20 | 20 | 60 |

Table 2 shows process gases used during the first and second steps (S20 and S22) and their flow rates. Table 2 also shows process time of each step while performing the first and second steps three times repeatedly.

As mentioned above, according to embodiments of the present invention, the ashing process using water vapor in the first and second steps is carried out at least two times. Consequently, the metal interconnection is protected from damage, and problems caused by the remaining photoresist and polymer are remarkably alleviated.

Although various preferred embodiments of the present invention have been disclosed herein for illustrative purposes, those skilled in the art will appreciate that various modifications, additions, and substitutions are possible without departing from the scope and spirit of the invention as provided in the accompanying claims.

What is claimed is:

1. A method of ashing a semiconductor device, the method comprising:

loading a semiconductor substrate including a metal interconnection and photoresist pattern into a chamber of an ashing apparatus having a plasma generator;

injecting a passivating gas into the chamber; and injecting a stripping gas into the chamber, wherein injecting the passivating gas and injecting the stripping gas are carried out at least two times repeatedly.

2. The method of claim 1, wherein the metal interconnection and the photoresist pattern are formed by:

forming a metal layer on the semiconductor substrate;

forming the photoresist pattern on the metal layer; and etching the metal layer using the photoresist pattern as an etch mask and using a gas mixture including $Cl_2$ and $BCl_3$ as an etch gas.

3. The method of claim 1, wherein the passivating gas includes water vapor.

4. The method of claim 1, wherein the stripping gas includes a mixture of oxygen, nitrogen and water vapor.

5. The method of claim 1, wherein the stripping gas includes a mixture of oxygen and nitrogen.

6. The method of claim 1, wherein the step of injecting the passivating gas and the step of injecting the stripping gas are carried out under a pressure of approximately 0.5 to 3 Torr.

7. The method of claim 1, wherein injecting the passivating gas and injecting the stripping gas are carried out in the chamber to which a plasma power of approximately 2000–3000W is applied.

8. The method of claim 1, wherein injecting the passivating gas and injecting the stripping gas are carried out at a temperature of approximately 200 to 270° C.

9. The method of claim 3, wherein the water vapor is injected at a flow rate of approximately 2000 to 4000 sccm.

10. The method of claim 1, wherein injecting the passivating gas is carried-out for approximately 5 to 40 seconds.

11. The method of claim 4, wherein the $O_2$ gas is injected at a flow rate of approximately 5000 to 10000 sccm.

12. The method of claim 4, wherein the $N_2$ gas is injected at a flow rate of approximately 300 to 800 sccm.

13. The method of claim 4, wherein the water vapor is injected at a flow rate of approximately 1 to 1000 sccm.

14. The method of claim 1, wherein injecting the stripping gas is carried out for approximately 5 to 60 seconds.

15. The method of claim 1, wherein injecting the passivating gas and injecting the stripping gas are carried out in the same chamber.

16. The method of claim 1, wherein injecting the passivating gas and injecting the stripping gas are carried out at least three times repeatedly.

17. A method of ashing a semiconductor device, the method comprising:

loading a semiconductor substrate including a metal interconnection and photoresist pattern into a chamber of an ashing apparatus having a plasma generator;

injecting a passivating gas into the chamber; and injecting a stripping gas into the chamber, re-injecting the passivating gas into the chamber; and re-injecting the stripping gas into the chamber.

18. The method of claim 17, further comprising:

re-injecting the passivating gas; and re-injecting the stripping gas.

* * * * *

UNITED STATES PATENT AND TRADEMARK OFFICE
CERTIFICATE OF CORRECTION

PATENT NO.    : 6,719,917 B2
DATED         : April 13, 2004
INVENTOR(S)   : Cho

It is certified that error appears in the above-identified patent and that said Letters Patent is hereby corrected as shown below:

Column 1,
Line 46, "using NH3 gas" should read -- using $NH_3$ gas --.

Column 3,
Line 47, "method for-fabricating" should read -- method for fabricating --.

Column 4,
Line 8, Table 2, "Final step" should read -- First step --.

Column 5,
Line 2, "is carried-out for" should read -- is carried out for --.

Signed and Sealed this

Eighth Day of February, 2005

JON W. DUDAS
*Director of the United States Patent and Trademark Office*